United States Patent
Bendapudi et al.

(10) Patent No.: US 7,868,244 B2
(45) Date of Patent: Jan. 11, 2011

(54) SOLAR CPV CELL MODULE AND METHOD OF SAFELY ASSEMBLING, INSTALLING, AND/OR MAINTAINING THE SAME

(75) Inventors: Satyam Bendapudi, Manchester, CT (US); Rakesh Radhakrishnan, Vernon, CT (US); Yu Chen, East Hartford, CT (US); Yirong Jiang, Manchester, CT (US)

(73) Assignee: United Technologies Corporation, Hartford, CT (US)

( * ) Notice: Subject to any disclaimer, the term of this patent is extended or adjusted under 35 U.S.C. 154(b) by 299 days.

(21) Appl. No.: 11/507,153

(22) Filed: Aug. 21, 2006

(65) Prior Publication Data
US 2008/0041444 A1     Feb. 21, 2008

(51) Int. Cl.
*H01L 25/00* (2006.01)
*H01L 31/00* (2006.01)
*H01L 31/042* (2006.01)

(52) U.S. Cl. .................................. 136/246; 136/251
(58) Field of Classification Search ....................... None
See application file for complete search history.

(56) References Cited

U.S. PATENT DOCUMENTS

| | | | |
|---|---|---|---|
| 4,830,678 A * | 5/1989 | Todorof et al. | 136/259 |
| 2001/0006066 A1 | 7/2001 | Cherney et al. | |
| 2005/0081909 A1 * | 4/2005 | Paull | 136/246 |
| 2006/0266408 A1 * | 11/2006 | Horne et al. | 136/246 |
| 2007/0251569 A1 | 11/2007 | Shan et al. | |
| 2008/0000516 A1 * | 1/2008 | Shifman | 136/246 |

* cited by examiner

*Primary Examiner*—Nam X Nguyen
*Assistant Examiner*—Kourtney R Salzman
(74) *Attorney, Agent, or Firm*—Kinney & Lange, P.A.

(57) ABSTRACT

A concentrated solar energy device is connectable to a solar array and includes a photovoltaic cell that provides electrical energy and heat from a solar energy source, a thermally conductive element, concentrating optics, and a housing. The concentrating optics are positioned between the solar energy source and the photovoltaic cell and are aligned with the solar energy source. The thermally conductive element functions to dissipate heat from the photovoltaic cell. The housing and the concentrating optics are attached to one another and together enclose the photovoltaic cell and a portion of the thermally conductive element. An optical film may be positioned over the concentrating optics during assembly, installation, and/or maintenance of the concentrated solar energy device.

17 Claims, 6 Drawing Sheets

SOLAR CPV CELL MODULE AND METHOD OF SAFELY ASSEMBLING, INSTALLING, AND/OR MAINTAINING THE SAME

BACKGROUND OF THE INVENTION

Solar cells, or photovoltaic cells, have the ability to convert sunlight directly into electricity. Conventional solar cells are approximately 15 percent efficient in converting absorbed light into electricity. Concentrated photovoltaic cells have the ability to capture more of the electromagnetic spectrum and are thus more efficient, converting absorbed light into electricity at about 30 percent efficiency. In order to capture the maximum amount of sunlight during the day, a tracker is connected to the photovoltaic cells and continuously aligns the light-absorbing panels of the photovoltaic cells in a direction perpendicular to rays from the sun so that the photovoltaic cells may absorb the highest amount of energy from the rays of sunlight. This is particularly important for high performance solar panels having concentrated photovoltaic cells.

To effectively absorb energy from the sun, numerous photovoltaic cells are typically positioned on a solar panel to capture an increased amount of sunlight. The photovoltaic cells are attached together on the panel with refractive or reflective optical lenses arranged above them to focus the sunlight. One problem with currently available concentrators is that if one of the photovoltaic cells is defective or damaged, the entire solar panel could become inoperable or be damaged. Conventional concentrating photovoltaic panels require dual axis tracking to collect the direct beam portion of solar irradiation. The ability to go to large concentration ratios (>50 suns) is limited by the tracking accuracy. The need for accurate tracking further limits the size of concentrator panels that may be mounted on a single tracker.

Furthermore, while the concentrators increase the efficiency of the solar cell system, improper handling of the concentrators during the installation, assembly, and maintenance of the solar panel can result in hazardous conditions. For example, operators handling the concentrators may be harmed if directly exposed to light, in the form of a high intensity beam, reflected from one of the concentrators. In other circumstances, light from the concentrators may also create a hazardous condition if the light is concentrated on flammable material positioned either in, or in close proximity with, the photovoltaic cells.

BRIEF SUMMARY OF THE INVENTION

In an exemplary embodiment, a concentrated solar energy device is connectable to a solar array and includes a photovoltaic cell that provides electrical energy and heat from a solar energy source, a thermally conductive element, concentrating optics, and a housing. The concentrating optics are positioned between the solar energy source and the photovoltaic cell and are aligned with the solar energy source. The thermally conductive element functions to dissipate heat from the photovoltaic cell. The housing and the concentrating optics are attached to one another and together enclose the photovoltaic cell and a portion of the thermally conductive element.

In another exemplary embodiment, a modular concentrated solar energy system includes a plurality of energy absorbing elements positioned on a panel. Each of the energy absorbing elements includes a photovoltaic cell, concentrating optics, and a thermally conductive element. The photovoltaic cell, concentrating optics, and thermally conductive element are all enclosed in a housing. The energy absorbing elements are connected to function independently of one another.

In yet another exemplary embodiment, a method of assembling, installing, or maintaining a modular energy absorbing device includes positioning an energy absorbing material on a light-capturing face of the energy absorbing device, assembling, installing, or maintaining the energy absorbing device, removing the energy absorbing material from the light-capturing face of the energy absorbing device, and operating the energy absorbing device.

DETAILED DESCRIPTION

Figure 1:
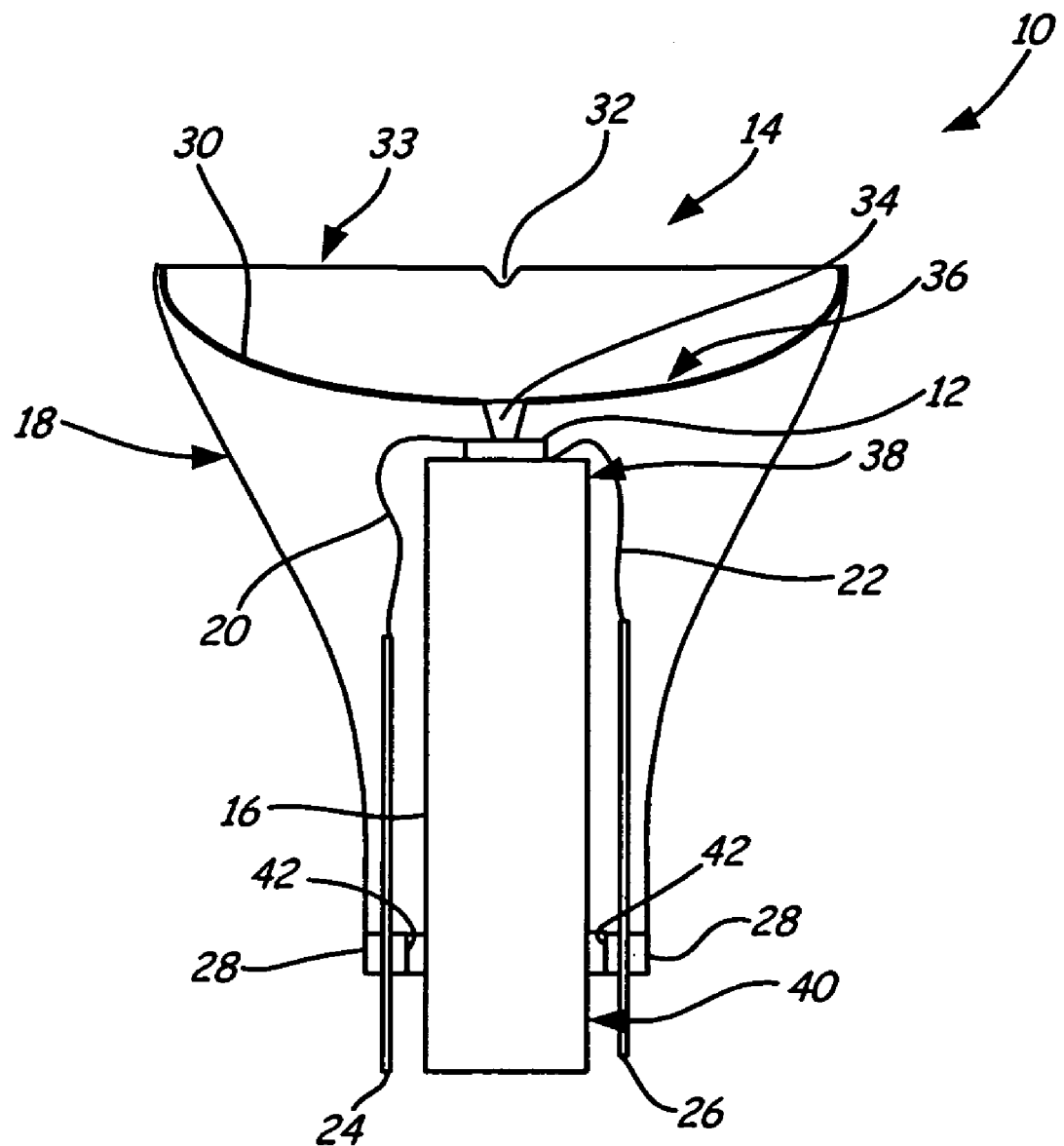
FIG. 1 is an enlarged schematic view of a solar energy device.

FIG. 1 shows an enlarged schematic view of solar energy device 10. Solar energy device 10 generally includes concentrated photovoltaic (CPV) cell 12, concentrator 14, heat conducting element 16, housing 18, first and second electrical connections 20 and 22, first and second electrical terminals 24 and 26, and seal 28. Solar energy device 10 may be manufactured using manufacturing methods and technologies currently available in the light bulb industry, leading to consistently high quality and lower costs. Solar energy device 10 also provides more robust and precise alignment between CPV 12 and concentrator 14.

In operation, CPV cell 12 is positioned directly beneath concentrator 14. Concentrator 14 functions similar to a lens and includes primary optic surface 30, secondary optic surface 32, collection face 33, and tertiary optic element 34. Concentrator 14 is aligned with respect to the sun to collect and focus a maximum amount of solar energy for the dimensions of CPV cell 12. Primary optic surface 30 has a convex shape and is formed by providing a reflective surface on convex face 36 such that light is focused onto secondary optical surface 32. Secondary optical surface 32 is a smaller convex reflective surface within collection face 33 and is located at the focal point of primary optical surface 30. Secondary optical surface 32 focuses the light captured by collection face 33 into a narrow beam that passes through tertiary optic element 34. Tertiary optic element 34 is prismatic and further narrows the light beam and is positioned at the most convex portion of primary optic surface 30 such that the distance between prismatic tertiary optical element 34 and CPV cell 12 is as small as possible. Although concentrator 14 is discussed as being formed of primary optic surface 30, secondary optic surface 32, collection face 33, and tertiary optic element 34, other embodiments of concentrator 14 are contemplated, as will be obvious to those skilled in the art. In one embodiment, concentrator 14 is made of optical glass or a low refraction index transparent plastic.

The high intensity beam of light is directed from concentrator 14 and absorbed into CPV cell 12 where it is converted into electrical energy and heat. Because CPV cell 12 is generally between 10% and 40% efficient, approximately 60% of the energy absorbed by CPV cell 12 is converted to heat. The heat must be dissipated from CPV cell 12 to prevent damage and decreased performance of CPV cell 12. Optionally, the dissipated heat may be recovered and used as thermal energy.

CPV cell 12 is positioned on heat conducting element 16, which dissipates the heat from CPV cell 12. Heat conducting element 16 has a top portion 38 and a bottom portion 40 and is formed of a material having good thermal conductivity, such as metal. For example, heat conducting element 16 may be formed of copper or aluminum. CPV cell 12 may be either chemically or mechanically attached to heat conducting element 16. To mechanically attach CPV cell 12 to heat conducting element 16, CPV cell 12 is physically pressed against and attached to top portion 38 of heat conducting element 16 using fixtures on heat conducting element 16. For example, the fixture may comprise a thin layer of a highly conductive interface material. To chemically attach CPV cell 12 to heat conducting element 16, the lowest layer of CPV cell 12 is chemically bonded with top portion 38 of heat conducting element 16. Chemical bonding of CPV cell 12 to heat conducting element 16 not only provides good thermal contact between CPV cell 12 and heat conducting element 16, but also increases the structural rigidity of solar energy device 10.

CPV cell 12 and heat conducting element 16 are enclosed within housing 18 with concentrator 14 forming the top surface of housing 18 to create a bulbous structure. Housing 18 acts to protect CPV cell 12 from environmental elements such as moisture. To protect CPV cell 12, the space within housing 18 is either evacuated space or filled with inert gas to ensure that there is substantially no oxygen within housing 18. Housing 18 may be formed of any material capable of withstanding the elevated temperatures of solar energy device 10. In one embodiment, housing 18 is formed of glass. Although housing 18 is depicted in FIG. 1 as having a bulbous shape, housing 18 of solar energy device 10 may take on various other shapes depending on the type of optics used to form concentrator 14.

First and second electrical wires 20 and 22 are positive and negative electrical leads, respectively, and tap the potential difference developed across CPV cell 12. In addition to being positioned on top of heat conducting element 16, CPV cell 12 is also connected to heat conducting element 16 by first and second electrical wires 20 and 22, which form electrical attachments to a top side of CPV cell 12. First and second electrical wires 20 and 22 are typically formed of aluminum, gold, or copper and are attached to CPV cell 12 by ultrasonic or thermosonic metal-to-metal bonding methods. If electrical wires 20 and 22 are formed of copper, electrical wires 20 and 22 may be attached to CPV cell 12 through soldering.

First and second electrical wires 20 and 22 are bonded to first and second terminals 24 and 26, respectively, which are thicker electrical terminals that are physically and electrically separated from heat conducting element 16. First and second terminals 24 and 26 are attached to an external device, such as a circuit, and transport current from CPV cell 12 to the external device.

CPV cell 12 and heat conducting element 16 are enclosed at the bottom of housing 18 by vacuum seal 28, which circumferentially surrounds bottom portion 40 of heat conducting element 16. Seal 28 is fused to housing 18 by fused glass ring 42 such that seal 28 is integral with housing 18. Although seal 28 extends from heat conducting element 16 to housing 18 to maintain an evacuated enclosure within housing 18, heat conducting element 16 and first and second terminals 24 and 26 extend through seal 28 through fused glass ring 42.

Figure 2A:
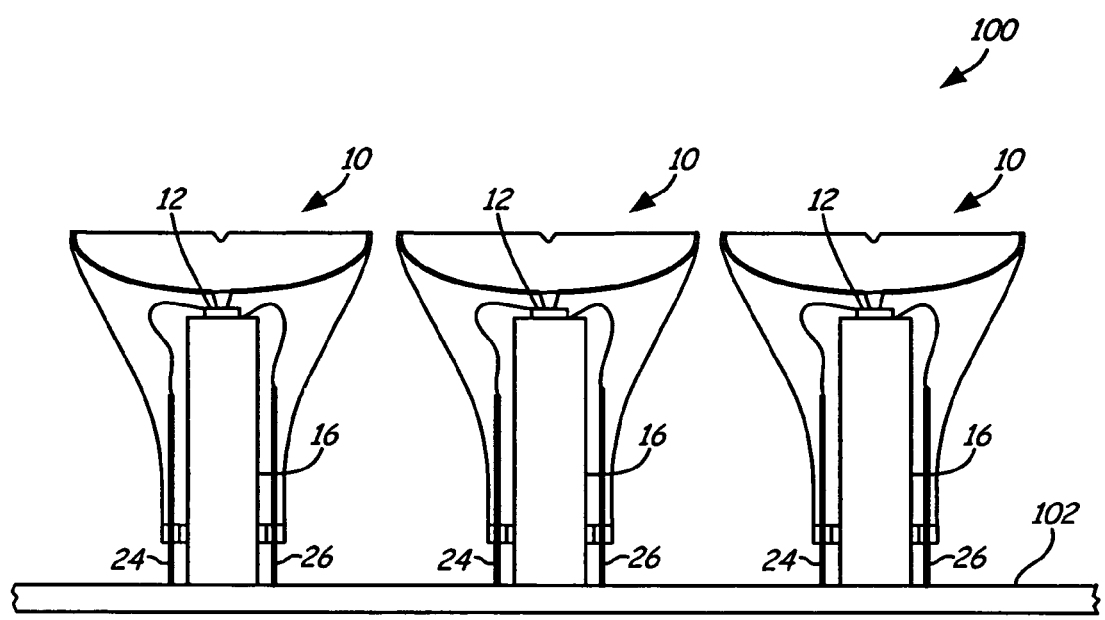
FIG. 2A is a partial schematic view of a first embodiment of mounting a plurality of solar energy devices to a solar panel.

FIG. 2A shows a partial schematic view of a plurality of solar energy devices 10 arranged on solar panel 100. Each CPV cell 12 produces between approximately 1 milliWatt (mW) and approximately 1 Watt of power. Thus, in order to provide enough power generation capability, a plurality of solar energy devices 10 are typically arranged in an array and are connected to each other to form solar panel 100. Solar energy devices 10 are arranged relative to one another with heat conducting element 16 and first and second terminals 24 and 26 of each solar energy device 10 connected to a direct current (DC) bus located within frame 102. The DC bus collects and transmits the direct current electricity produced by CPV cells 12. All of the direct current electricity collected by the DC bus is combined into a single power output. The modularity of solar panel 100 allows any damage to solar panel 100 to be pinpointed so that a damaged solar energy device 10 may be replaced without disrupting the remaining solar energy devices 10 on solar panel 100.

Once CPV cells 12 are connected to the DC bus, frame 102 may be placed on a solar tracker, allowing solar energy devices 10 to track the sun. Solar panel 100 is capable of outputting any range of power, from Watts to kilowatts. In the first embodiment of mounting solar energy devices 10 to solar panel 100, solar energy devices 10 are mounted perpendicular to frame 102. CPV cells 12 are thus aligned with the sun as a unit depending on the position of frame 102. Although FIG. 2A depicts three solar energy devices 10, solar panel 100 may include as many CPV cells 10 as required to perform the desired function.

Figure 2B:
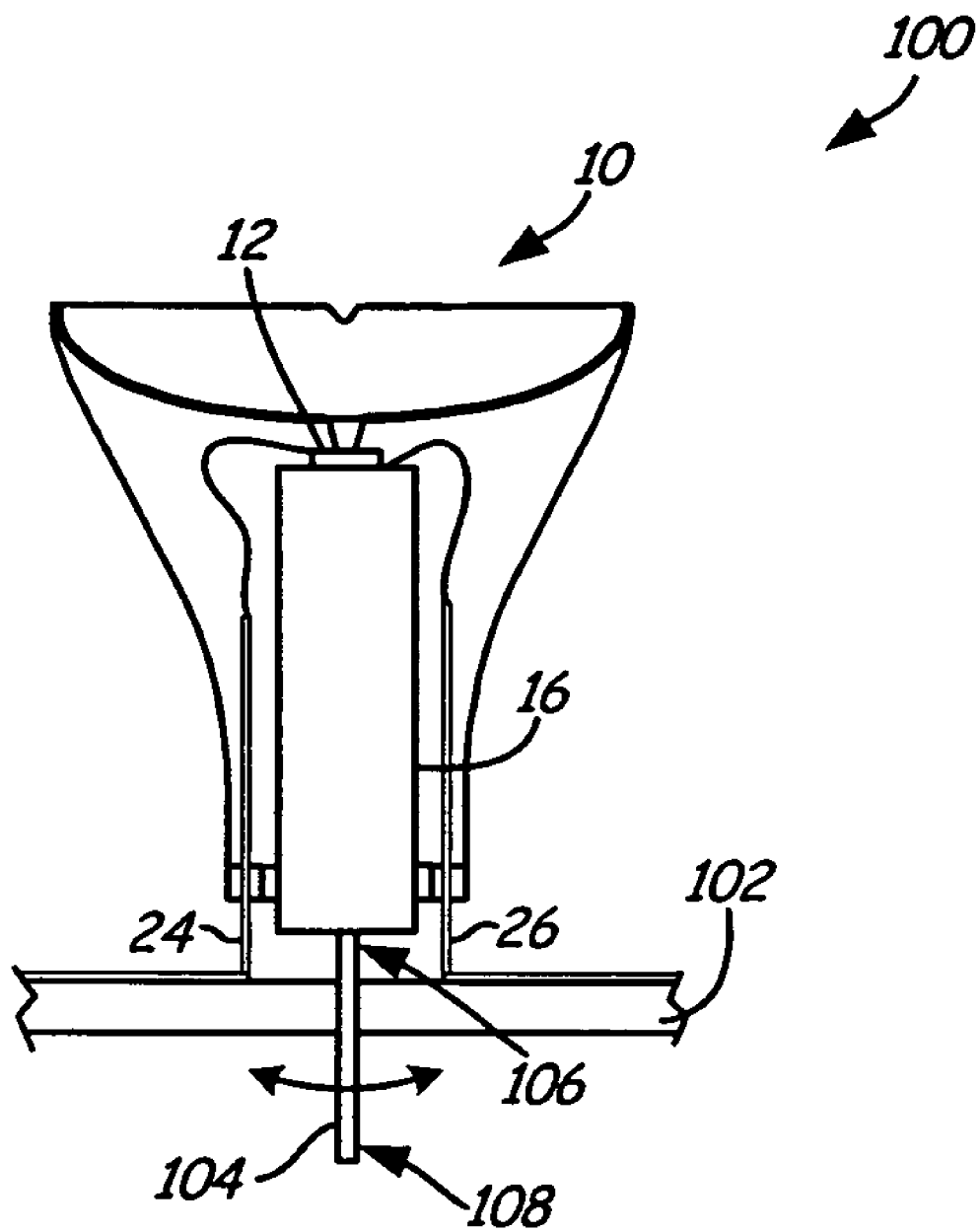
FIG. 2B is a partial schematic view of a second embodiment of mounting the solar energy device to the solar panel.

FIG. 2B shows a second embodiment of mounting solar energy devices 10 to solar panel 100. For simplicity, only one solar energy device 10 is shown in FIG. 2B mounted to solar panel 100. However, all solar energy devices 10 mounted on solar panel 100 may be mounted in the same manner. In the second embodiment, solar energy device 10 is pivotally mounted to frame 102 of solar panel 100 by a pivot shaft 104. Pivot shaft 104 includes a first end 106 and a second end 108. First end 106 of pivot shaft 104 is attached to a bottom end of heat conducting element 16 and second end 108 of pivot shaft 104 is inserted through frame 102. Pivot shaft 104 elevates heat conducting element 16 such that heat conducting element 16 is no longer in direct contact with the DC bus. Because solar energy device 10 is elevated, first and second terminals 24 and 26 are extended to reach the DC bus. As pivot shaft 104 pivots solar energy device 10 relative to frame 102, first and second terminals 24 and 26 also bend accordingly. Pivot shaft 104 may be attached to frame 102 by any means known in the art as long as pivot shaft 104 is capable of rotationally and elevationally adjusting solar energy device 10. An actuator may be connected to pivot shaft 104 to align solar energy device 10 in relation to the sun. Although the second embodiment is discussed in terms of one solar energy device 10, each solar energy device 10 of solar panel 100 may either be individually controlled, or all of solar energy devices 10 may be controlled as a single unit.

Figure 3:
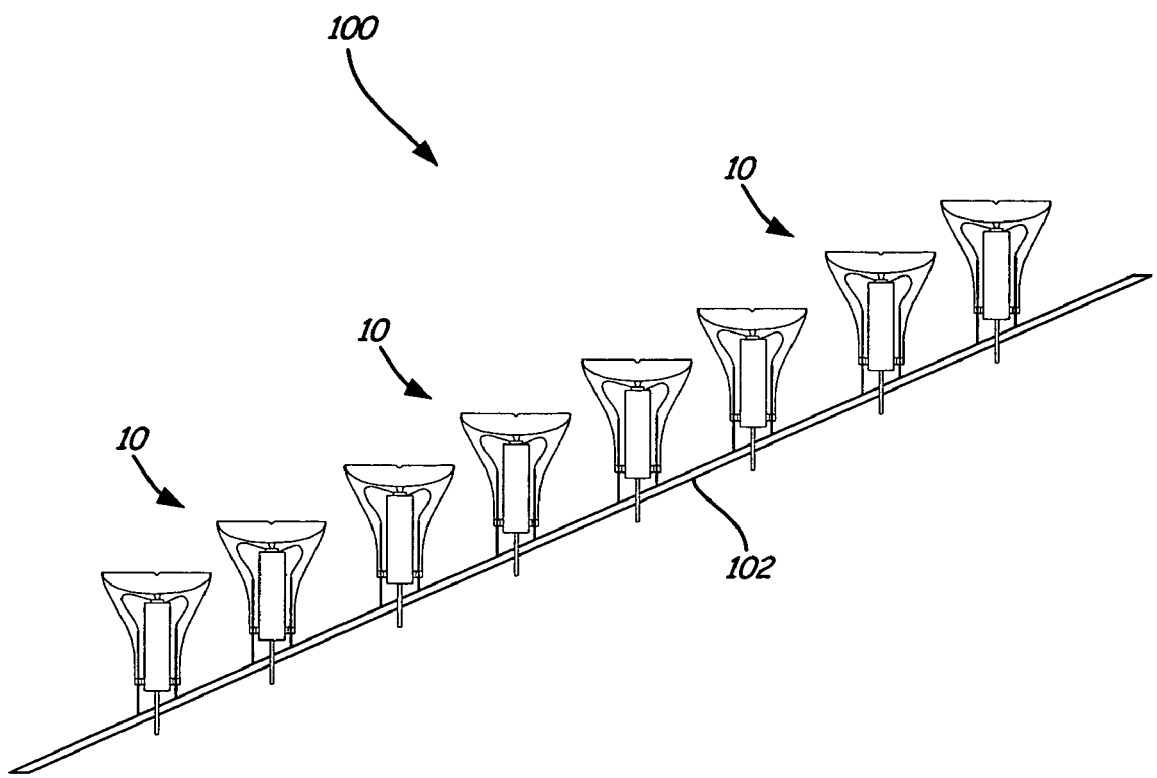
FIG. 3 is a side view of a plurality of solar energy devices aligned on the solar panel.

FIG. 3 shows a side view of solar energy devices 10 aligned in a parallel array on solar panel 100. Solar energy devices 10 are positioned on solar panel 100 such that they absorb a desired amount of energy from the sun. As can be seen in FIG. 3, solar energy devices 10 are pivotally connected to frame 102 of solar panel 100 as described in the second embodiment of mounting solar energy devices 10 to solar panel 100. Solar energy devices 10 are thus positioned at an angle toward the sun and are not directly perpendicular to frame 102. In one embodiment, solar panel 100 sits on a dual axis tracker, adjusting solar panel 100 in the azimuthal and linear directions to track the sun. Solar energy devices 10 may be arranged on frame 102 of solar panel 100 in any type of array, such as a parallel array.

Figure 4:
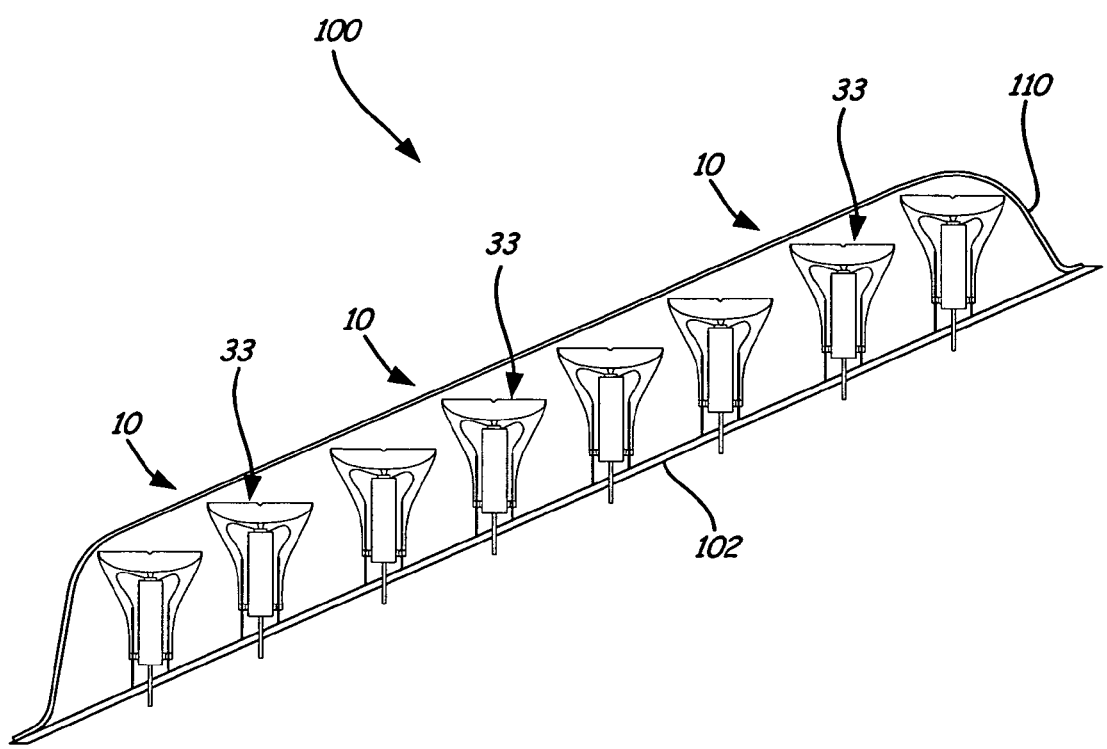
FIG. 4 is a side view of the solar panel covered by an energy absorbing material.

FIG. 4 shows a side view of solar panel 100 covered by energy absorbing material 110. Because assembly, installation, and maintenance of CPV cell modules 12 of solar panel 100 are typically accomplished visually, surrounding elements may be affected during alignment of the concentrated beam from concentrators 14 to CPV cells 12 due to improper handling of concentrators 14. For example, improper handling of the concentrated beam can result in high intensity radiation reflecting off concentrator 14 and causing a hazardous condition to an operator or material positioned proximate CPV cell 12.

To prevent the light from the concentrated beams from unintentionally striking objects in close proximity to solar energy devices 10, energy absorbing material 110 is used to cover collection faces 33 of concentrators 14. Energy absorbing material 110 may be mounted either on each individual solar energy device 10 or entirely over solar panel 100 by any method known in the art, including, but not limited to: adhesion means or mechanical means. If an adhesion means is used, the adhesive is covered with a protective coating that is removed when energy absorbing material 110 is ready for use. Energy absorbing material 110 may be mechanically mounted to solar panel 100 by bolts. The radiation and optical properties of energy absorbing material 110 are designed to reduce the energy intensity of the concentrated beam to a value that is not capable of burning or igniting a fire. Energy absorbing material 110 may be, for example: an optical filter or a darkened optical film. As mentioned above, although FIG. 4 shows energy absorbing material 110 positioned over solar panel 100, energy absorbing material 110 may also be manufactured or cut into smaller pieces to cover only concentrator 14 of each solar energy device 10. Alternatively, solar energy device 10 may be manufactured with energy absorbing material 110 adhered to concentrator 14. After installation of solar energy device 10 onto solar panel 100, energy absorbing material 110 may be removed from collection face 33 of concentrator 14 of solar energy device 10.

Figure 5:
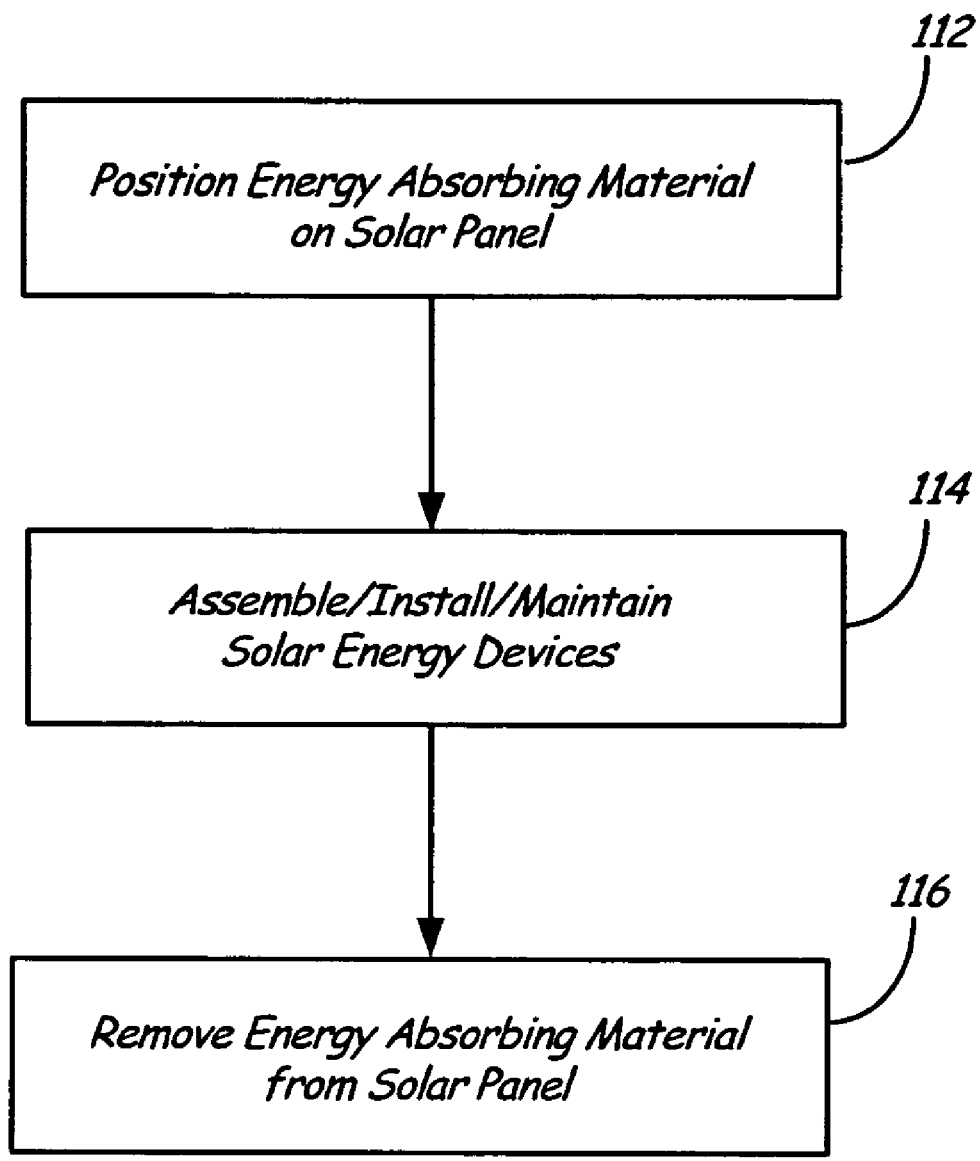
FIG. 5 is a flow chart of a method of assembling, installing, or maintaining the solar energy devices.

FIG. 5 shows a method of assembling, installing, or maintaining solar energy devices 10. During assembly, installation, or maintenance of solar energy devices 10, energy absorbing material 110 is first mounted on collection faces 33 of concentrators 14, Box 112. As shown in Box 114, the operator may then proceed to assemble, install, or maintain solar energy devices 10. Use of energy absorbing material 110 reduces the potential of unintentional contact to collection faces 33 of concentrators 14 and reduces the amount of skill required by the operator when assembling, installing, or maintaining solar energy devices 10. Once assembly, installation, or maintenance of solar panel 100 is complete, energy absorbing material 110 is removed to allow normal function of solar energy devices 10, Box 116.

In one embodiment, mounting of energy absorbing material 110 onto solar energy device 10 may be mandated during assembly or installation of solar panel 100. In another embodiment, maintenance access to solar panel 100 may be disabled unless energy absorbing material 110 is in place.

The solar energy device includes a concentrated photovoltaic (CPV) cell, a heat conducting element, and related electrical wiring housed within an evacuated enclosure. A concentrator having optics is positioned directly over the CPV cell so that the solar energy devices may collect the desired amount of solar energy. The CPV cell is positioned on the heat conducting element within the evacuated enclosure. The electrical wiring connects the CPV cell to a circuit, which is connected to a plurality of additional CPV cells. The solar energy devices are positioned in an array on a solar panel to collect energy from the sun. During assembly, installation, or maintenance of the solar energy devices on the solar panel, an energy absorbing material may be positioned to help prevent hazardous conditions to the operator or surrounding areas due to misdirected reflection of the concentrated beam from the concentrators. The solar energy device allows for a modular construction of the solar panel and replacement of individual parts as they are damaged.

Although the present invention has been described with reference to preferred embodiments, workers skilled in the art will recognize that changes may be made in form and detail without departing from the spirit and scope of the invention.

The invention claimed is:

1. A concentrated solar energy device connectable to a solar array, the device comprising:
    a photovoltaic cell for producing electrical energy and heat from solar energy received from a solar energy source;
    electrical terminals that are electrically connected to the photovoltaic cell by electrical leads for receiving electrical energy produced by the photovoltaic cell;
    a thermally conductive element for dissipating the heat from the photovoltaic cell, the thermally conductive element having a top portion on which the photovoltaic cell is mounted and a bottom portion;
    a concentrating optics element constructed of a solid, unitary, transparent material, and positioned between the photovoltaic cell and the solar energy source, wherein the concentrating optics element comprises a collection face, a primary optic surface, a secondary optic surface, and a tertiary optic element that are aligned with the photovoltaic cell so that the solar energy passes through the collection face to the primary optic surface, is reflected by the primary optic surface to the secondary optic surface, is reflected by the secondary optic surface to the tertiary optic element, and is focused by the tertiary optic element onto the photovoltaic cell; and
    a housing having a flared first end sealed to an outer periphery of the concentrating optics element, and a sealed second end through which lower ends of the electrical terminals and the bottom portion of the thermally conductive element extend, wherein the bottom of the thermally conductive element extends through the sealed second end between the lower ends of the electrical terminals, the housing and the concentrating optics element forming a sealed enclosure surrounding the photovoltaic cell.

2. The device of claim 1, wherein the sealed enclosure is evacuated.

3. The device of claim 1, wherein the sealed enclosure is filled with inert gas.

4. The device of claim 1, wherein the photovoltaic cell is mechanically attached to the thermally conductive element.

5. The device of claim 1, wherein the photovoltaic cell is chemically attached to the thermally conductive element.

6. The device of claim 1, and further comprising an optical film positioned over the concentrating optics element prior to connecting the device to the solar array.

7. The device of claim 1, and further comprising electrical leads connected to the photovoltaic cell, wherein the electrical leads connect to the electrical terminals for transporting current from the photovoltaic cell to an external device.

8. The device of claim 1, wherein the device is pivotally attached to the solar array.

9. The device of claim 1, wherein the thermally conductive element has a first portion in thermal contact with the photovoltaic cell within the sealed enclosure, and has a second portion that extends out of the sealed enclosure through the second end of the housing.

10. A modular concentrated solar energy system, the system comprising:
   a panel for aligning the solar energy system with the sun; and
   a plurality of energy absorbing elements positioned on the panel, each of the plurality of energy absorbing elements being modular, sealed unit having a photovoltaic cell, concentrating optics including a primary optic surface, a secondary optic surface, a collection face, and a tertiary optic element such that the solar energy passes through the collection face to the primary optic surface, is reflected by the primary optic surface to the secondary optic surface, is reflected by the secondary optic surface to the tertiary optic element, and is focused by the tertiary optic element onto the photovoltaic cell, a thermally conductive element in thermal contact with the photovoltaic cell, electrical terminals electrically connected to the photovoltaic cell by electrical leads, and a housing having a flared first end sealed to an outer periphery of the concentrating optics, the housing extending downwardly from the first end to a sealed second end thereby enclosing photovoltaic cell and at least partially enclosing the thermally conductive element, the electrical terminals and the thermally conductive element extending through the sealed second end of the housing, the thermally conductive element extending through the sealed second end between the electrical terminals, the housing and the concentrating optics forming a sealed enclosure;
   wherein the plurality of energy absorbing elements are connected to function independently of one another.

11. The system of claim 10, wherein each of the plurality of energy absorbing elements further comprises electrical leads connected to the photovoltaic cell extending to the terminals for transporting current from the photovoltaic cell to a direct current bus connecting the plurality of energy absorbing elements.

12. The system of claim 10, wherein each of the sealed enclosures is an evacuated enclosure.

13. The system of claim 10, wherein each of the plurality of energy absorbing elements are pivotally connected to the panel.

14. The system of claim 10, wherein each of the plurality of energy absorbing elements are positioned perpendicularly with the panel.

15. A concentrated solar energy device connectable to a solar array, the device comprising:
   a solid, transparent, bulbous housing having a flared upper end and a sealing ring at a lower end;
   a concentrating optics element attached to the flared upper end of the housing;
   a thermally conducting element having a top located near the flared upper end of the housing and the concentrating optics element, and a bottom extending through the lower end of the housing and sealed to the sealing ring;
   a photovoltaic cell located on the top of the heat conducting element immediately beneath the concentrating optics element for receiving solar energy from the concentrating optics element and providing electrical energy and heat; and
   at least one electrical lead connected to the photovoltaic cell and extending downwardly on either side of the thermally conducting element to connect with an electrical terminal, the electrical terminal extending through the lower end of the housing on either side of the thermally conductive element while remaining physically and electrically separate therefrom;
   wherein the concentrating optics element comprises a collection face, a primary optic surface, a secondary optic surface, and a tertiary optic element, such that the solar energy passes through the collection face to the primary optic surface, is reflected by the primary optic surface to the secondary optic surface, is reflected by the secondary optic surface to the tertiary optic element, and is focused by the tertiary optic element onto the photovoltaic cell and a sealed enclosure is formed around the photovoltaic cell by the housing, the electrical terminal and the concentrating optics element.

16. The device of claim 15, wherein the sealed enclosure is evacuated.

17. The device of claim 15, wherein the sealed enclosure is filled with inert gas.

* * * * *